(12) United States Patent
Jeon

(10) Patent No.: US 11,469,755 B2
(45) Date of Patent: Oct. 11, 2022

(54) COMPARATOR FOR CONTROLLING DEAD-TIME BETWEEN SWITCHING TRANSISTORS

(71) Applicant: Agency for Science, Technology and Research, Singapore (SG)

(72) Inventor: Yong-Joon Jeon, Singapore (SG)

(73) Assignee: AGENCY FOR SCIENCE, TECHNOLOGY AND RESEARCH, Singapore (SG)

( * ) Notice: Subject to any disclaimer, the term of this patent is extended or adjusted under 35 U.S.C. 154(b) by 0 days.

(21) Appl. No.: 17/425,604

(22) PCT Filed: Jan. 21, 2020

(86) PCT No.: PCT/SG2020/050027
§ 371 (c)(1),
(2) Date: Jul. 23, 2021

(87) PCT Pub. No.: WO2020/153904
PCT Pub. Date: Jul. 30, 2020

(65) Prior Publication Data
US 2022/0085803 A1     Mar. 17, 2022

(30) Foreign Application Priority Data
Jan. 25, 2019  (SG) ............................ 10201900698X

(51) Int. Cl.
*H03K 17/00* (2006.01)
*H03K 17/284* (2006.01)
*H03K 17/06* (2006.01)
*H03K 17/16* (2006.01)

(52) U.S. Cl.
CPC ........ *H03K 17/284* (2013.01); *H03K 17/063* (2013.01); *H03K 17/161* (2013.01)

(58) Field of Classification Search
None
See application file for complete search history.

(56) References Cited

U.S. PATENT DOCUMENTS

| 5,541,541 A | 7/1996 | Salamina et al. |
| 11,057,023 B1 * | 7/2021 | Abesingha ........... H03K 17/165 |
| 2006/0164867 A1 | 7/2006 | Dikken et al. |
| (Continued) | | |

FOREIGN PATENT DOCUMENTS

CN          208015586 U     10/2018

OTHER PUBLICATIONS

International Search Report issued in International Application No. PCT/SG2020/050027, dated Jun. 6, 2020.

(Continued)

*Primary Examiner* — Tuan T Lam
(74) *Attorney, Agent, or Firm* — Mark H. Whittenberger; Holland & Knight LLP

(57) ABSTRACT

This document discloses a comparator that is configured to control dead-time between two or more switching transistors. In particular, it is disclosed that the comparator is configured to generate a suitable delay between the switching "OFF" of a transistor and the switching "ON" of another transistor so that the amount of shoot through current flowing between these two transistors are greatly minimized.

14 Claims, 7 Drawing Sheets

(56) References Cited

U.S. PATENT DOCUMENTS

| | | | |
|---|---|---|---|
| 2007/0229050 A1* | 10/2007 | Shigeta | H03K 17/0822 323/282 |
| 2008/0205100 A1* | 8/2008 | Sakamoto | H02M 3/1588 363/67 |
| 2011/0050322 A1* | 3/2011 | Sicard | H03K 17/164 327/419 |
| 2016/0126946 A1* | 5/2016 | Joos | H03K 17/165 327/109 |
| 2016/0191047 A1 | 6/2016 | Yamamura | |
| 2017/0070200 A1* | 3/2017 | Chang | H03F 3/2171 |
| 2017/0222637 A1* | 8/2017 | Tsunetsugu | H03K 17/168 |
| 2017/0302178 A1* | 10/2017 | Bandyopadhyay | H03F 3/2171 |
| 2018/0069546 A1* | 3/2018 | Shankar | H03K 17/063 |
| 2018/0131282 A1* | 5/2018 | Chen | H02M 3/33592 |
| 2018/0141506 A1* | 5/2018 | Yamashita | F16K 31/0679 |
| 2019/0190511 A1* | 6/2019 | Matsubara | H03K 17/166 |
| 2019/0280473 A1* | 9/2019 | Akahane | H03K 17/18 |

OTHER PUBLICATIONS

Niwa, A. et al., Novel dead time controlled gate driver using the current sensor of SIC-MOSFET. IECON 2015—41st Annual Conference of the IEEE Industrial Electronics Society, Nov. 9, 2015, pp. 1651-1656.

* cited by examiner

COMPARATOR FOR CONTROLLING DEAD-TIME BETWEEN SWITCHING TRANSISTORS

RELATED APPLICATIONS

The subject application is a U.S. National Stage application of International Application No. PCT/SG2020/050027, filed on 21 Jan. 2020, which claims the benefit of SG Application No. 10201900698X, filed on 25 Jan. 2019. The contents of which are herein incorporated by reference in their entirety.

FIELD OF THE INVENTION

This invention relates to a comparator that is configured to control dead-time between two or more switching transistors. In particular, the comparator is configured to generate a suitable delay between the switching "OFF" of a transistor and the switching "ON" of another transistor so that the amount of shoot through current flowing between these two transistors are greatly minimized.

SUMMARY OF THE PRIOR ART

A "pulse generator" or "pulser" is an electronic device used to inject a pulsed signal into a circuit of interest. Pulses produced by these devices are commonly used as test signals for digital electronic circuits, or may be used to drive any other electronic device that operates based on a pulsed input signal. A pulser may be configured to produce a single pulse, a fixed number (burst) of pulses, or a continuous train of pulses into the device under-test or to drive the device.

Such pulsers or in particular, high voltage (HV) pulsers are widely used in various applications such as in medical imaging systems and in drivers for various microelectromechanical systems (MEMS) such as MEMS gyroscopes and piezoelectric devices for sensors, etc.

In particular, pulsers are widely used in the area of ultrasound medical imaging applications as these applications require sophisticated excitation waveforms and sequential scanning methods to drive a large number of piezoelectric or capacitive-electrostatic element arrays contained within these applications. Such pulsers are commonly made up of a few pairs of P-type and N-type high voltage power transistors whereby the transistor pairs are driven by a fast gate driver circuit as each channel of the pulse generator would have to produce high voltages and currents to charge or discharge the load capacitance at ultrasonic speeds (i.e. between 1 to 20 MHz or higher frequency range). This places a huge demand on the pulser as the load capacitance of the piezoelectric or capacitive-electrostatic elements and the cable equivalent capacitance combined together usually are quite large.

It is also a requirement that such pulsers have to generate steep pulses with short propagation delays, with the delays being in a range between 10 ns and 35 ns and the rise and fall times of a pulser's outputs being in a range between 10 ns and 40 ns. Typically, the rise time and fall time of a pulser's outputs are defined as the time taken for a pulse to rise from 10% to 90% of the pulse peak or to fall from 90% to 10% of the pulse peak, respectively.

However, when a P-type Metal-Oxide-Semiconductor (PMOS) and an N-type Metal-Oxide-Semiconductor (NMOS) transistor of the pulser are switched rapidly, shoot-through current may occur during the ON/OFF transitions of these PMOS and NMOS transistor switches. This happens when both PMOS and NMOS transistors switch ON concurrently. An exemplary pulser known in the art is illustrated in FIG. 1 whereby pulser 100 comprises a PMOS switch 110 and a NMOS switch 120 which are both driven by a gate driver 102. For the circuit illustrated in FIG. 1, shoot-through current, $I_{Shoot\_Thru}$ happens when both the output NMOS and PMOS switches turn on simultaneously and this leads to an increase in the overall power consumption of pulser 100. Those skilled in the art find it difficult to address this shoot through current as it is difficult to set an optimum dead-time between the switching of output PMOS and NMOS switches while ensuring that the pulser is able to meet the required propagation delays and rising/falling times are still met.

In existing solutions, it has been proposed that the issue of shoot-through current be addressed by using a non-overlapping clock generation circuit to control the timings of the rising and falling signals generated by driver 102, or by using an external circuit to provide delay times between the switching transistors, or by adjusting a resistor value to control the delay time between the switching transistors. However, these approaches are all not ideal as it is difficult to control an external circuit or to adjust a resistor value to achieve optimal delay times between the switching transistors.

For those above reasons, those skilled in the art are constantly striving to come up with ways to minimize the shoot through current between the switching transistors in a pulser when the switches are transitioning between ON-OFF states while ensuring that the pulser is still able to meet the required propagation delays and the required rise and fall times.

SUMMARY OF THE INVENTION

The above and other problems are solved and an advance in the art is made by systems and methods provided by embodiments in accordance with the invention.

A first advantage of embodiments of a circuit and method in accordance with the invention is that the comparator greatly reduces the amount of shoot-through current that occurs in a pulser circuit by preventing switching transistors in the pulser circuit from switching ON simultaneously.

A second advantage of embodiments of a circuit and method in accordance with the invention is that the comparator circuit consumes little static power and is able to operate at fast switching speeds.

A third advantage of embodiments of a circuit and method in accordance with the invention is that when the comparator is enabled in the pulser, the pulser is able to generate steep pulses with low power consumption.

The above advantages are provided by embodiments of a device or method in accordance with the invention operating in the following manner.

According to a first aspect of the invention, a comparator circuit configured to generate a delay between an ON time for a first transistor (a NMOS switch 120) and an OFF time for a second transistor (a PMOS switch 110) in a pulser circuit is disclosed, the comparator circuit comprising a gate voltage sensing circuit configured to generate a gate monitoring current $I_{PGATE}$ based on a detected gate voltage of the second transistor $V_{PGATE}$; a current sensing circuit configured to generate a drain monitoring current $I_{PMOS}$ based on a detected drain current of the second transistor; and a current comparator circuit configured to compare a reference current $I_{CMP\_REF}$ to a sum of a scaled gate monitoring current $I_{PGATE\_MON}$ that is scaled from the gate monitoring current $I_{PGATE}$ and a scaled drain monitoring current $I_{PGATE.MON}$ that is scaled from the drain monitoring current $I_{PMOS}$, whereby the first transistor in the pulser circuit is turned ON when the sum of the scaled gate monitoring current $I_{PGATE.MON}$ and the scaled drain monitoring current $I_{PMOS.MON}$ is less than the reference current $I_{CMP.REF}$.

With reference to the first aspect, the gate monitoring current $I_{PGATE}$ is directly proportional to a voltage difference between the detected gate voltage of the second transistor $V_{PGATE}$ and a source voltage of the second transistor $V_{DDH}$.

With reference to the first aspect, the gate voltage sensing circuit comprises: a first current source having an input terminal which is provided with the source voltage of the second transistor $V_{DDH}$ and an output terminal connected to a source of a switch transistor, wherein, the switch transistor is configured to regulate the gate monitoring current $I_{PGATE}$ at a drain of the switch transistor based on the detected gate voltage of the second transistor $V_{PGATE}$ that is provided to the gate of the switch transistor.

With reference to the first aspect, the gate voltage sensing circuit comprises: a resistor having a first end which is provided with the source voltage of the second transistor $V_{DDH}$ and a second end connected to a source of a switch transistor wherein, the switch transistor is configured to regulate the gate monitoring current $I_{PGATE}$ at a drain of the switch transistor based on the detected gate voltage of the second transistor $V_{PGATE}$ that is provided to the gate of the switch transistor.

With reference to the first aspect, the gate voltage sensing circuit further comprises: a pair of NMOS transistors in a current mirror configuration whereby one of the pair of NMOS transistors is configured to receive the gate monitoring current $I_{PGATE}$ from the drain of the switch transistor such that the gate monitoring current $I_{PGATE}$ is scaled and replicated at a drain of another one of the pair of NMOS transistors and the scaled gate monitoring current $I_{PGATE.MON}$ is provided to the current comparator circuit in place of the gate monitoring current $I_{PGATE}$.

With reference to the first aspect, the current sensing circuit comprises: a PMOS sensing transistor having a gate which is provided with the gate voltage of the second transistor $V_{PGATE}$, a source which is provided with the source voltage of the second transistor $V_{DDH}$, and a drain connected to a first input terminal of a voltage copy circuit, wherein the voltage copy circuit is configured to provide the drain of the PMOS sensing transistor with a same voltage as a drain of the second transistor $V_{OUT}$ through the first input terminal of the voltage copy circuit, the voltage copy circuit further comprising a second input terminal that is provided with the drain voltage of the second transistor $V_{OUT}$, a first output terminal that is connected to a second current source and a second output terminal that is connected to a third current source; a negative feedback loop formed between the first input and the first output terminals of the voltage copy circuit, the negative feedback loop configured to direct a drain monitoring current $I_{PMOS}$ from the PMOS sensing transistor away from the voltage copy circuit and through a current branch formed by the negative feedback loop; and a NMOS sensing transistor connected to the negative feedback loop, the NMOS sensing transistor configured to generate the scaled drain monitoring current $I_{PMOS.MON}$ based on the drain monitoring current $I_{PMOS}$ flowing through the current branch formed by the negative feedback loop.

With reference to the first aspect, the voltage copy circuit comprises: a pair of PMOS transistors in a current mirror configuration whereby a source of one of the pair of PMOS transistors is configured to detect the drain voltage of the second transistor $V_{OUT}$ through the second input terminal of the voltage copy circuit and another one of the pair of PMOS transistors is configured to replicate the detected drain voltage of the second transistor $V_{OUT}$ at its source, whereby the source of the another one of the pair of PMOS transistors is connected to the drain of the PMOS sensing transistor through the first input terminal of the voltage copy circuit.

With reference to the first aspect, the second current source comprises a first NMOS transistor configured as a current source, a drain of the first NMOS transistor being connected to the first output terminal of the voltage copy circuit; and the third current source comprises a second NMOS transistor configured as a current source, a drain of the second NMOS transistor being connected to the second output terminal of the voltage copy circuit.

With reference to the first aspect, the negative feedback loop comprises: a first NMOS high voltage feedback transistor having a drain connected to the drain of the PMOS sensing transistor and a source connected to a drain of a second NMOS feedback transistor, whereby a gate of the second NMOS feedback transistor is connected to the first output terminal of the voltage copy circuit.

With reference to the first aspect, a gate of the NMOS sensing transistor is connected to the gate of the NMOS feedback transistor.

With reference to the first aspect, the drain monitoring current $I_{PMOS}$ from the PMOS sensing transistor comprises a scaled value of the drain current of the second transistor and is obtained based on a channel width ratio between the PMOS sensing transistor and the second transistor; and the scaled drain monitoring current $I_{PMOS.MON}$ from the NMOS sensing transistor comprises a re-scaled or replicated value of the drain monitoring current $I_{PMOS}$ from the PMOS sensing transistor and is obtained based on a channel width ratio between the NMOS sensing transistor and the second NMOS feedback transistor.

With reference to the first aspect, the current comparator circuit comprises: a fourth current source configured to generate the reference current $I_{CMP.REF}$; a summation node located between a drain of the fourth current source and a terminal of a capacitor whereby the summation node is configured to receive the scaled gate monitoring current $I_{PGATE.MON}$ and the scaled drain monitoring current $I_{PMOS.MON}$ and to obtain a difference between the reference current $I_{CMP.REF}$ and the sum of the scaled gate monitoring current $I_{PGATE.MON}$ and the scaled drain monitoring current $I_{PMOS.MON}$.

With reference to the first aspect, the comparator circuit further comprises a level-shifter provided between an input of the pulser circuit and the gate of the second transistor.

According to a second aspect of the invention, a method to generate a delay between an ON time for a first transistor and an OFF time for a second transistor in a pulser circuit using a comparator circuit is disclosed, the method comprising the steps of: generating, using a gate voltage sensing circuit, a gate monitoring current $I_{PGATE}$ based on a detected gate voltage of the second transistor $V_{PGATE}$; generating, using a current sensing circuit, a drain monitoring current $I_{PMOS}$ based on a detected drain current of the second transistor; and comparing, using the current comparator circuit, a reference current $I_{CMP.REF}$ to a sum of a scaled gate monitoring current $I_{PGATE.MON}$ that is scaled from the gate monitoring current $I_{PGATE}$ and a scaled drain monitoring current $I_{PMOS.MON}$ that is scaled from the drain monitoring current $I_{PMOS}$; and switching the first transistor in the pulser circuit ON when the sum of the scaled gate monitoring current $I_{PGATE\_MON}$ and the scaled drain monitoring current $I_{PMOS\_MON}$ is less than the reference current $I_{CMP\_REF}$.

BRIEF DESCRIPTION OF THE DRAWINGS

The above advantages and features in accordance with this invention are described in the following detailed description and are shown in the following drawings.

DETAILED DESCRIPTION

This invention relates to a comparator that is configured to control dead-time between two or more switching transistors in a pulser by generating a suitable delay between the switching "OFF" of a transistor and the switching "ON" of another transistor so that the amount of shoot through current flowing between these two transistors are greatly minimized. In general, the comparator comprises a gate voltage sensing circuit, a current sensing circuit and a current comparator circuit that is configured to compare current produced by the gate voltage sensing circuit with current produced by the current sensing circuit to set an appropriate delay time between the switching OFF of a transistor and the switching ON of another transistor. In other words, the comparator will only allow a second switch transistor to switch ON after the comparator has determined that a first switch transistor has completely switched OFF. This ensures that the first and second switch transistors will never switch ON concurrently.

Figure 1:
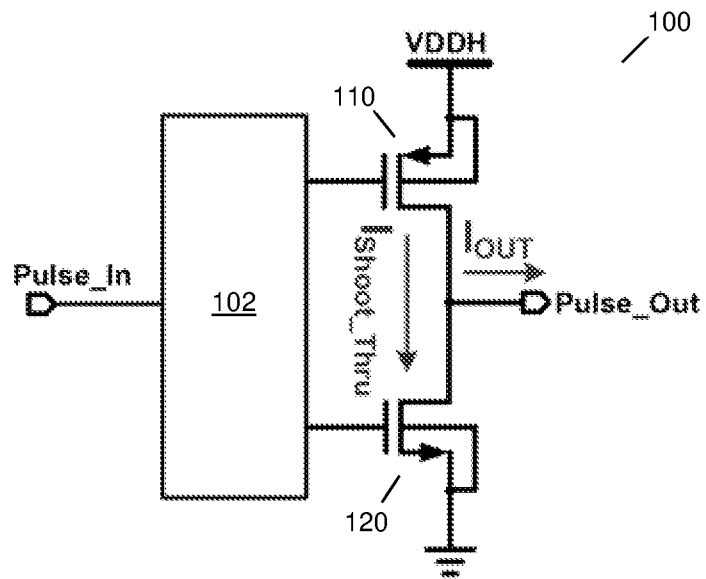
FIG. 1 illustrating a system representative of pulser circuit as known by those skilled in the art.
Figure 2:
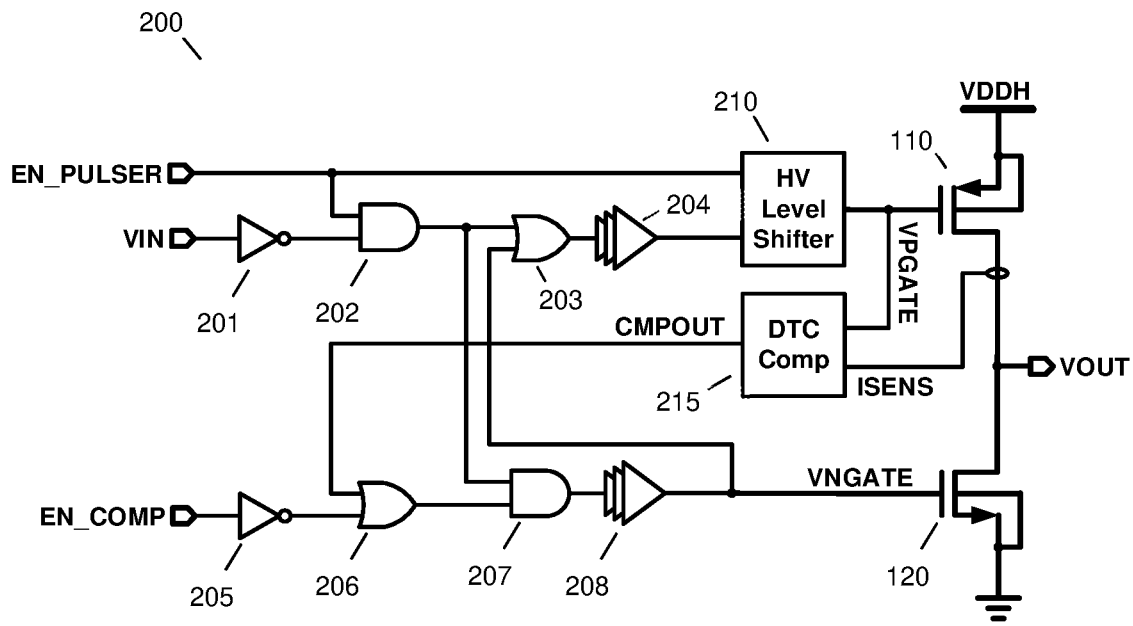
FIG. 2 illustrating a block diagram of a pulser circuit having a comparator in accordance with embodiments of the invention.

FIG. 2 illustrates a pulser circuit 200 that incorporates comparator circuit 215 in accordance with embodiments of the invention. Pulser circuit 200 comprises three input ports, EN_PULSER, VIN and EN_COMP, whereby VIN is the input port for receiving an input pulsed signal, EN_PULSER is the input port for receiving a control signal to enable pulser circuit 200 and EN_COMP is the input port for receiving a control signal to enable comparator circuit 215. Pulser circuit 200 also comprises a first switching transistor 110, a second switching transistor 120, a high voltage level shifter 210 and a number of logic gates 201-208. The detailed workings of the logic gates are omitted for brevity as these are common logic gates known to one skilled in the art. In the embodiment illustrated in FIG. 2, switching transistor 110 comprises a P-type Metal-Oxide-Semiconductor (PMOS) transistor while switching transistor 120 comprises an N-type Metal-Oxide-Semiconductor (NMOS) transistor. One skilled in the art will recognize that other types of switching transistors may be used in place of these two transistors without departing from the invention and that the logic gates used in pulser circuit 200 may be reconfigured accordingly to provide a suitable control signal or voltage level to control the switching rate of these two transistors.

In operation, comparator circuit 215 will monitor the gate voltage and the drain current of switching transistor 110 simultaneously to ensure that switching transistor 120 will only be switched ON once switching transistor 110 has completely switched OFF. Comparator circuit 215 does this by generating a suitable delay between the time the input pulse provided to VIN port becomes a "LOW" voltage level and the time a "HIGH" voltage level is provided to the gate of NMOS switching transistor 120. This delay ensures that PMOS switching transistor 110 is completely OFF and that no drain current is flowing through this transistor before NMOS switching transistor 120 is allowed to switch ON.

It is useful to note that in general, NMOS transistors have much faster switching speeds than PMOS transistors. Thus, when the signal applied to input port VIN transitions from a low voltage level to a high voltage level (causing a low voltage level to be provided to the gate of the NMOS transistor), no significant shoot-through current occurs because the NMOS transistor switches OFF quickly, well before the PMOS transistor switches ON.

However, when the signal applied to input port VIN transitions from a high voltage level to a low voltage level, the drain current of the PMOS transistor may still flow even though the voltage provided to the gate of the PMOS transistor has transitioned to a high voltage level. If the NMOS transistor switches ON before the PMOS transistor switches OFF completely, a significant shoot-through current will occur which leads to a sizable increase in the power consumption of the pulser circuit. This problem is addressed by the use of comparator circuit 215 in pulser circuit 200.

Figure 3A:
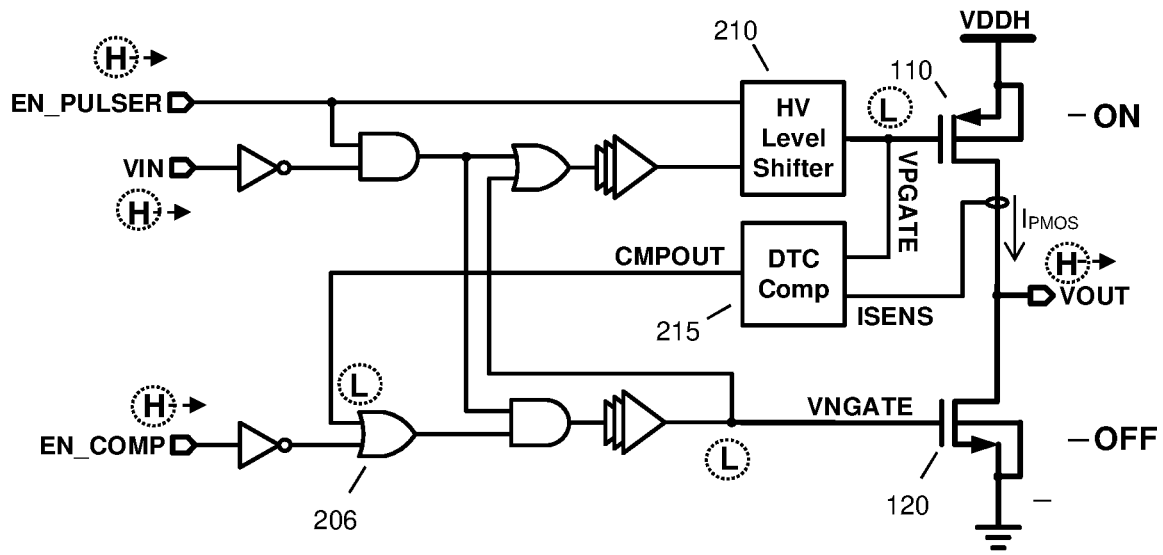
FIG. 3a illustrating an operation of a pulser circuit having a comparator in accordance with embodiments of the invention when an input pulse is at a high level.
Figure 3B:
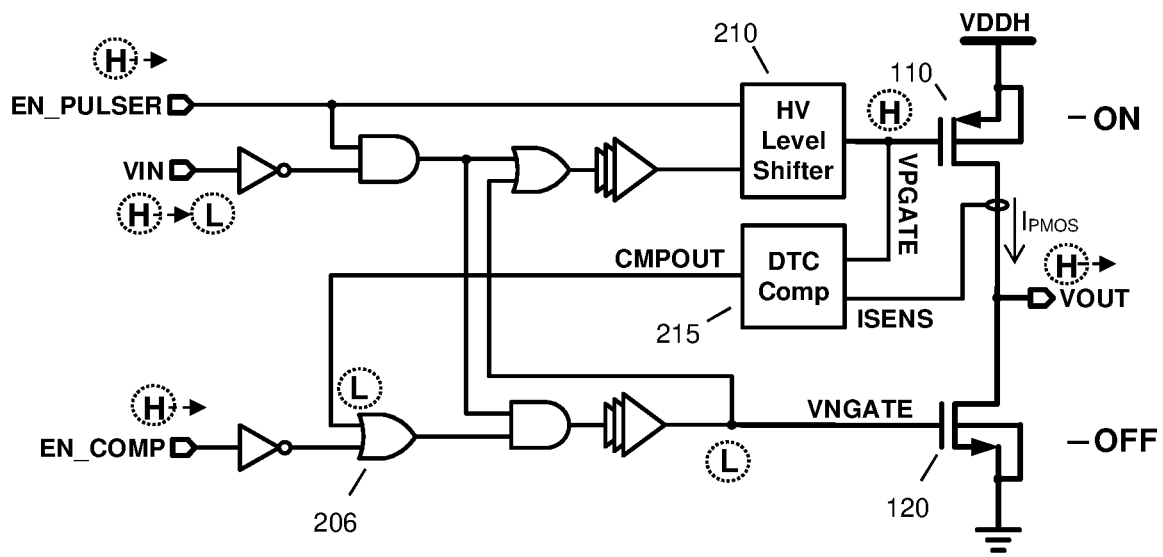
FIG. 3b illustrating an operation of a pulser circuit having a comparator in accordance with embodiments of the invention when an input pulse is transitioning from a high level to a low level.
Figure 3C:
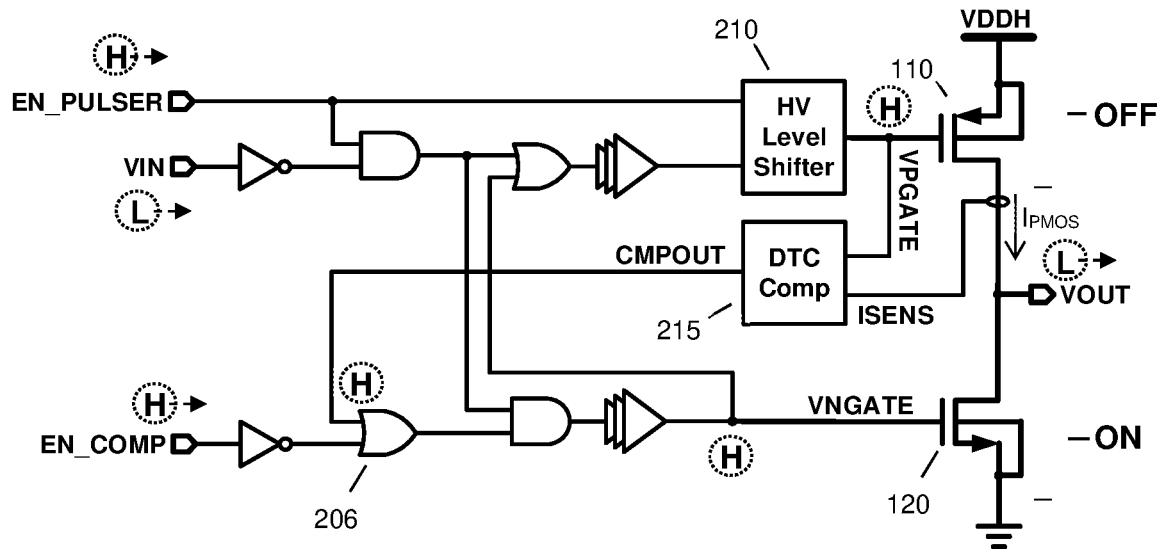
FIG. 3c illustrating an operation of a pulser circuit having a comparator in accordance with embodiments of the invention when an input pulse is at a low level.

FIGS. 3a-3c illustrate the operation of pulser circuit 200 when comparator circuit 215 is enabled. In FIG. 3a, it is assumed that a high voltage level is provided to the input ports EN_PULSER, VIN and EN_COMP to initiate the operation of pulser circuit 200. When a high voltage level is provided to the input port VIN, this causes a low voltage level to be provided to the gates of switching transistor 110 and 120. This in turn causes switching transistor 110 (which is a PMOS transistor) to switch ON causing the output port, VOUT, of the pulser circuit to be at a high voltage level. At the same time, comparator circuit 215 causes a low voltage level to be provided to the gate of switching transistor 120 (which is an NMOS transistor) causing switching transistor 120 be switched OFF. Hence, under this configuration, no current will flow through switching transistor 120 while the output voltage at VOUT is at a high voltage level.

In FIG. 3b, pulser circuit 200 and comparator circuit 215 are enabled by providing high voltage levels to input ports EN_PULSER and EN_COMP. As the voltage level at the input port VIN transitions from a high to a low voltage level, this causes the voltage level at the gate of switching transistor 110 to become high. Although a high voltage level has been provided to the gate of switching transistor 110, this transistor does not switch OFF immediately and neither does the drain current flowing through this transistor stop immediately. As a result, comparator circuit 215 causes a low voltage level to be maintained at the gate of switching transistor 120 thereby ensuring that this transistor remains switched OFF to prevent excessive current from flowing in this circuit.

When comparator circuit 215 has determined that switching transistor 110 has completely switched OFF, comparator circuit 215 then causes the voltage level at the gate of switching transistor 120 be at a high voltage level. When this happens, switching transistor 120 then switches ON causing the output port, VOUT, to be at a low voltage level. This configuration is illustrated in FIG. 3c. As switching transistor 120 only switches ON when switching transistor 110 has completely switched OFF, this ensures that no excessive current flows in this circuit.

Figure 4:
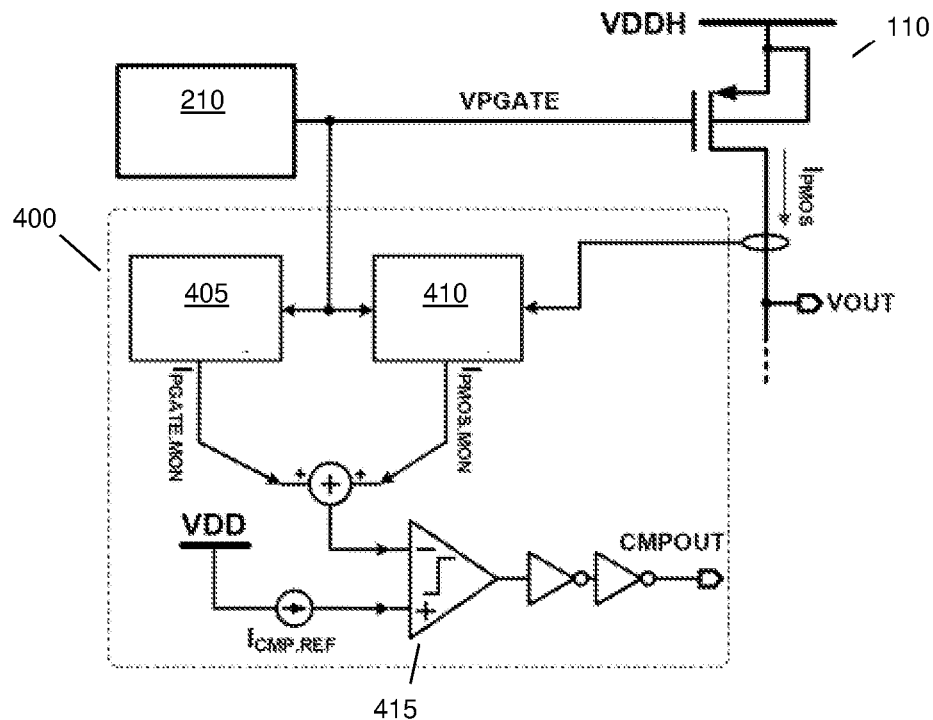
FIG. 4 illustrating a block diagram of the comparator in accordance with embodiments of the invention.

FIG. 4 illustrates a block diagram of modules contained within comparator circuit 400 in accordance with embodiments of the invention. As illustrated in FIG. 4, comparator circuit 400 monitors both the gate voltage, VPGATE, of switching transistor 110 and the drain current $I_{PMOS}$ of switching transistor 110 simultaneously and generates an appropriate output voltage at its output port, CMPOUT, based on the values of these two monitored parameters. A gate voltage sensing module 405 provided within circuit 400 is configured to convert the gate voltage VPGATE into sensed gate current $I_{PGATE.MON}$ and a current sensing module 410 provided within circuit 400 is configured to convert the drain current $I_{PMOS}$ into sensed drain current $I_{PMOS.MON}$. The sensed currents $I_{PGATE.MON}$ and $I_{PMOS.MON}$ are then summed and provided to current comparator 415. Current comparator 415 then compares the summed currents to a reference current $I_{CMP.REF}$ to determine if switching transistor 110 has completely switched OFF. In other words, if the gate voltage VPGATE is at a low voltage level or if drain current $I_{PMOS}$ is still flowing, current comparator 415 will generate a low voltage level at the output port CMPOUT. Conversely, if module 405 determines that gate voltage VPGATE is at a high voltage level and if drain current $I_{PMOS}$ is no longer detected, current comparator 415 will then generate as its output port CMPOUT a high voltage level to allow switching transistor 120 to switch on. In accordance with embodiments of the invention, modules within comparator circuit 400 may be implemented using low voltage CMOS transistors and this is advantageous as these transistors may operate with a low voltage supply resulting in a circuit that consumes lower power and operates faster.

In operation, gate voltage sensing module 405 is configured to continuously detect the voltage of gate voltage VPGATE. Module 405 then obtains the difference in voltage between the detected gate voltage VPGATE and a supply voltage VDDH whereby this difference in voltage is then converted by module 405 into a corresponding sensed gate current $I_{PGATE.MON}$.

Figure 5:
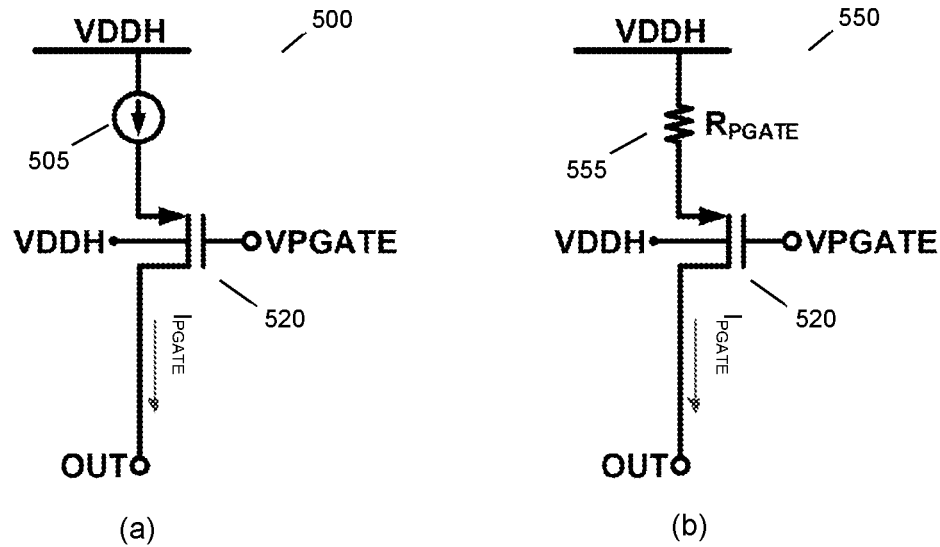
FIG. 5a illustrating a circuit diagram of a PMOS gate voltage sensing circuit in accordance with an embodiment of the invention.
FIG. 5b illustrating a circuit diagram of another PMOS gate voltage sensing circuit in accordance with an embodiment of the invention.

Exemplary circuits of gate voltage sensing module 405 are illustrated in FIGS. 5a and 5b. In accordance with embodiments of the invention, FIG. 5a illustrates gate voltage sensing circuit 500 which comprises switch transistor 520 which is biased by current source 505 and supply voltage VDDH. In this embodiment of the invention, switch transistor 520 comprises a PMOS transistor however; one skilled in the art will recognise that other types of transistors may be used without departing from the invention as long as the appropriate biasing voltages/currents are provided to the switch transistor. The amount of sensed gate current $I_{PGATE.MON}$ that flows through circuit 500 is controlled by the voltage difference between gate voltage VPGATE and supply voltage VDDH. Hence, as the gate voltage VPGATE varies, the sensed gate current $I_{PGATE.MON}$ will vary accordingly.

FIG. 5b illustrates another gate voltage sensing circuit 550 which comprises switch transistor 520 which is similarly biased by supply voltage VDDH and by resistor $R_{PGATE}$ which is connected in series between its source terminal and the supply voltage VDDH. Similar to that of circuit 500, the amount of sensed gate current $I_{PGATE.MON}$ that flows through circuit 550 is then controlled by the voltage difference between gate voltage VPGATE and supply voltage VDDH. Hence, as the gate voltage VPGATE changes, the sensed gate current $I_{PGATE.MON}$ will change accordingly.

Figure 6:
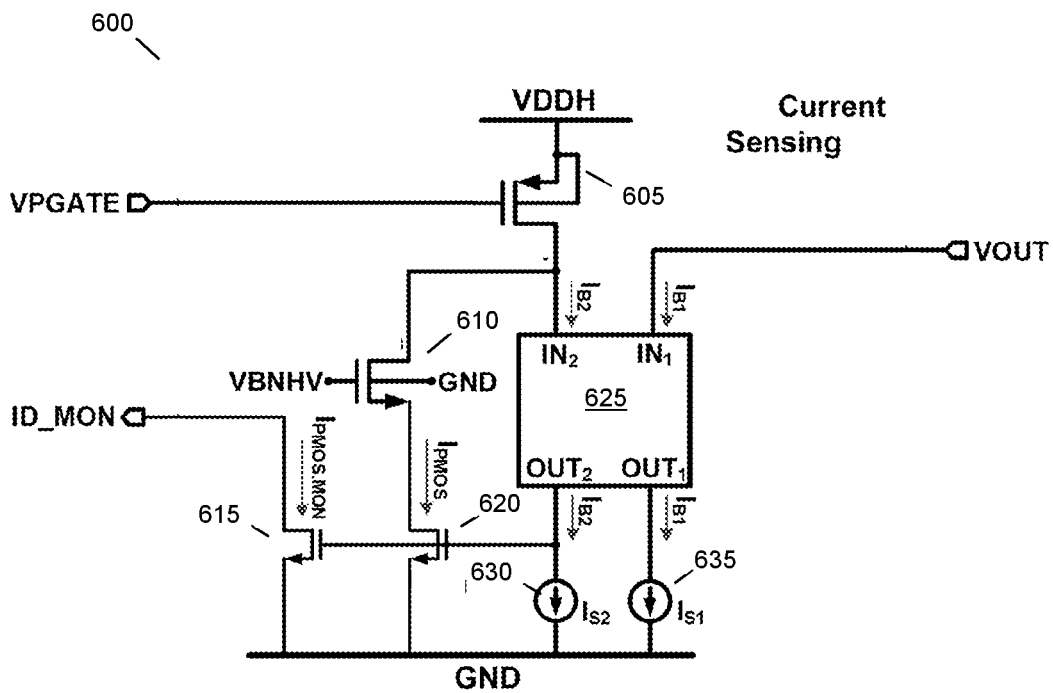
FIG. 6 illustrating a circuit diagram of a PMOS current sensing circuit in accordance with embodiments of the invention.

An exemplary circuit of current sensing module 410 is illustrated in FIG. 6. Current sensing circuit 600 comprises two input ports, whereby a first port is connected to the gate of switch transistor 110 to detect gate voltage VPGATE and a second port is connected to the output port VOUT to detect the output voltage; and one output port, ID_MON which outputs the sensed drain current $I_{PMOS.MON}$. Circuit 600 also comprises a voltage copy module 625, high voltage transistors 605, 610, and NMOS transistors 615, 620 and current sources 630 and 635. In this embodiment of the invention, high voltage transistors 605 and 610 comprise a high voltage PMOS and NMOS transistors respectively while transistors 615 and 620 comprise NMOS transistors. One skilled in the art will recognise that other types of transistors may be used without departing from the invention as long as the appropriate biasing voltages/currents are provided to the respective switch transistors accordingly.

Figure 7A:
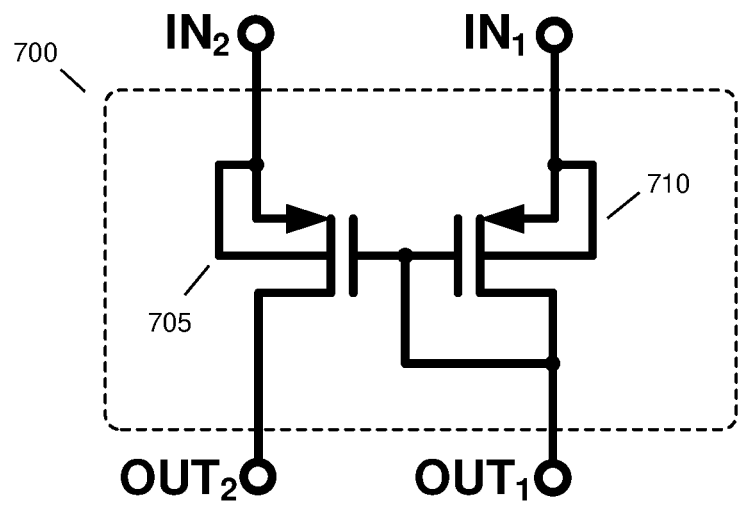
FIG. 7a illustrating a circuit diagram of a PMOS current mirror circuit in accordance with an embodiment of the invention.
Figure 7B:
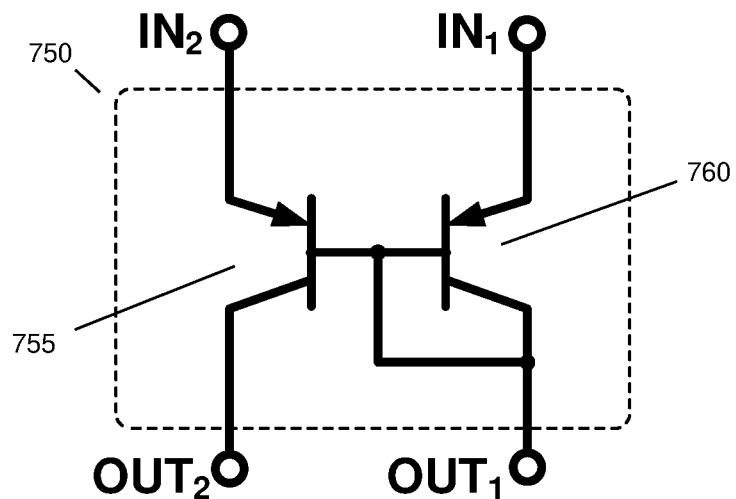
FIG. 7b illustrating a circuit diagram of a PNP current mirror circuit in accordance with an embodiment of the invention.

Voltage copy module 625 is configured to duplicate the voltage that is provided to the input terminal $IN_1$ to input terminal $IN_2$ when the bias currents $IB_1$ and $IB_2$ are identical with each other. In embodiments of the invention, voltage copy module 625 may be implemented using current mirror configurations. Such exemplary circuits are illustrated in FIGS. 7a and 7b. FIG. 7a illustrates circuit 700 comprising PMOS transistors 705 and 710 configured in a current mirror configuration while FIG. 7b illustrates circuit 750 comprising PNP-bipolar junction transistors (BJT) 755 and 760 configured in a current mirror configuration. In other embodiments of the invention, voltage copy module 625 may also comprise cascode type current mirror circuits.

A current branch from input port $IN_2$ to output port $OUT_2$ of voltage copy module 625, passes through transistors 610 (or may also be known as a first NMOS feedback transistor) and 620 (or may also be known as a second NMOS feedback transistor), and returns to input port $IN_2$ of module 625, forms a negative feedback current branch for voltage copy module 625. Due to this negative feedback branch and under the assumption that currents $IB_1$ and $IB_2$ are negligible compared to the drain current of switching transistor 605, most of the drain current for high voltage transistor 605 (or may be also known as the PMOS sensing transistor) will flow through the current branch comprising of transistors 610 and 620. Thus, the drain current of NMOS transistor 620, $I_{PMOS}$, will essentially be the same as the drain current of switching transistor 605. Further, as NMOS transistor 615 (or also may be known as NMOS sensing transistor) shares a common gate voltage as NMOS transistor 620, transistor 615 will generate a sensing current $I_{PMOS.MON}$ that is scaled from the drain current $I_{PMOS}$ according to the ratio of the channel widths between transistors 615 and 620 respectively.

Figure 8:
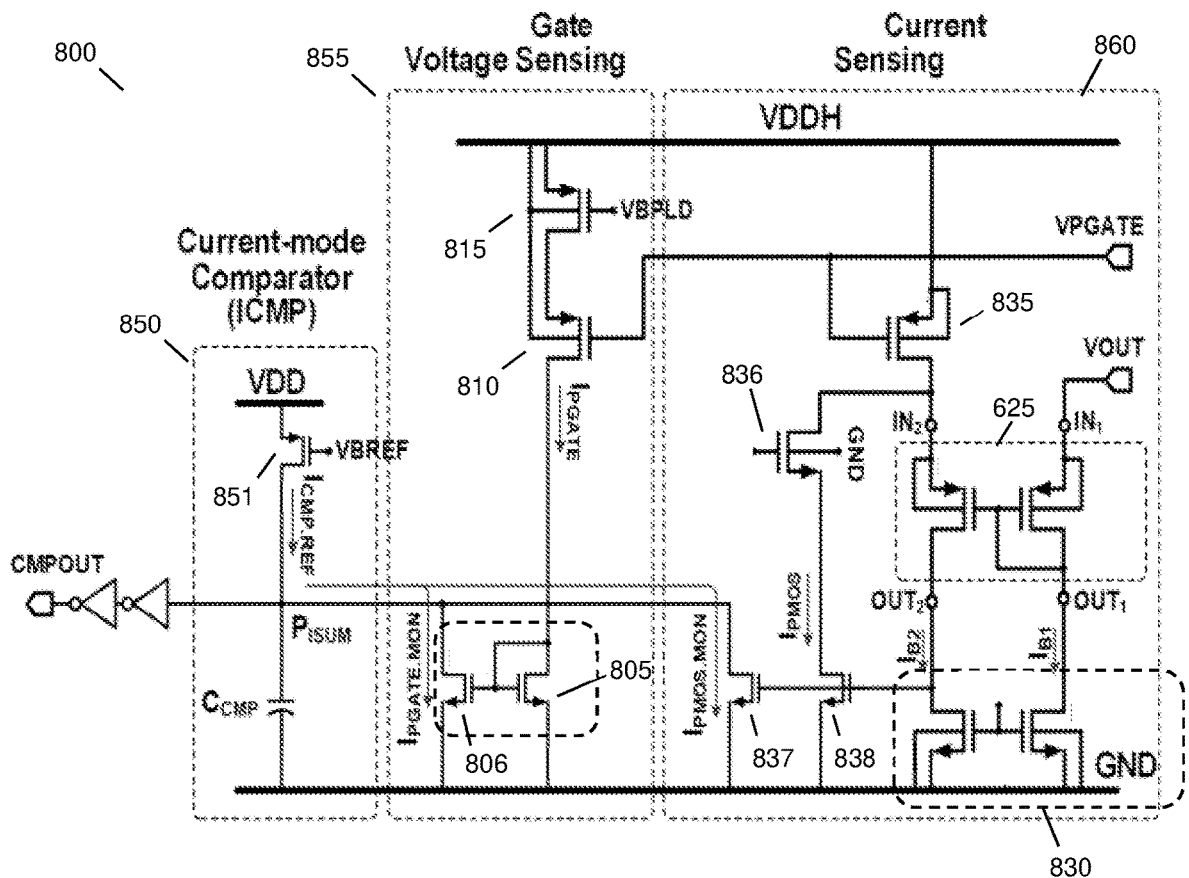
FIG. 8 illustrating an overall circuit diagram of the comparator in accordance with embodiments of the invention.

In accordance with embodiments of the invention, a circuit diagram of the entire comparator module is illustrated in FIG. 8. Comparator module 800 comprises current-mode comparator circuit 850, gate voltage sensing circuit 855 and current sensing circuit 860.

Gate voltage sensing circuit 855 comprises high voltage PMOS transistors 810, 815 and NMOS transistors 805, 806. Transistor 815 acts as a current source for drain current $I_{PGATE}$ and transistor 810 is configured to control the current flow of drain current $I_{PGATE}$. The gate voltage VPGATE of switching transistor 110 (see FIG. 2) is provided to the gate of transistor 810 and this gate voltage is used to control the flow of drain current $I_{PGATE}$ in circuit 855. The resulting drain current $I_{PGATE}$ that flows in circuit 855 is then duplicated and re-directed as sensed gate current $I_{PGATE.MON}$ by a current mirror circuit made up of transistors 805 and 806.

Current sensing circuit 860 comprises high voltage PMOS transistor 835, high voltage NMOS transistor 836, NMOS transistors 837, 838, and voltage copy circuit 625 which is driven by current source circuit 830. The currents of the current source circuit 830, $I_{B1}$ and $I_{B2}$, are chosen to be much smaller than the drain current of PMOS transistor 835 as such; most of the current flowing through PMOS transistor 835 is directed to flow through the current branch comprising high voltage NMOS transistor 836 and NMOS transistor 838. High voltage PMOS transistor 835 is configured to act as a sensing transistor for the drain current of switching transistor 110 (see FIG. 2) whereby the gate of PMOS transistor 835 shares the gate voltage VPGATE of switching transistor 110 and the drain of high voltage PMOS transistor 835 shares the drain voltage of switching transistor 110 accordingly. This occurs because the gate voltage VPGATE is provided directly to the gate of PMOS transistor 835 as illustrated in FIG. 8 while voltage copy circuit 625 copies the drain voltage at the output port VOUT, of switching transistor 110 (from circuit 625's input port $IN_1$) and replicates this voltage from output port VOUT, at the drain of PMOS transistor 835 (at circuit 625's input port $IN_2$).

It can be said that the current $I_{PMOS}$ is essentially the same as the drain current of PMOS transistor 835 and the current $I_{PMOS}$ is essentially the scaled value of the drain current of switching transistor 110 (see FIG. 2) and is dependent on the ratio of the channel widths between switching transistor 110 and PMOS transistor 835. NMOS transistors 837 and 838 share the same gate voltage as such, the drain current $I_{PMOS}$ flowing through NMOS transistor 838 will be replicated as sensed current $I_{PMOS.MON}$ that flows through NMOS transistor 837 and this current is further scaled according to the ratio of the channel widths between NMOS transistors 838 and 837.

The sensed currents $I_{PGATE.MON}$ and $I_{PMOS.MON}$ are then summed at node $P_{ISUM}$ that is provided within current-mode comparator circuit 850. At the same time, at node $P_{ISUM}$, the summed sensed currents are compared with a reference current $I_{CMP.REF}$ that is generated by a current source 851. If the summed sensed currents are larger than the reference current $I_{CMP.REF}$, comparator circuit 850 will generate a low voltage level as its output CMPOUT. Conversely, if the summed sensed currents are smaller than the reference current $I_{CMP.REF}$, current-mode comparator circuit 850 will generate a high voltage level at its output CMPOUT as this implies that comparator circuit 800 has determined that switching transistor 110 has completely switched OFF as such, switching transistor 120 may now switch ON.

Figure 9:
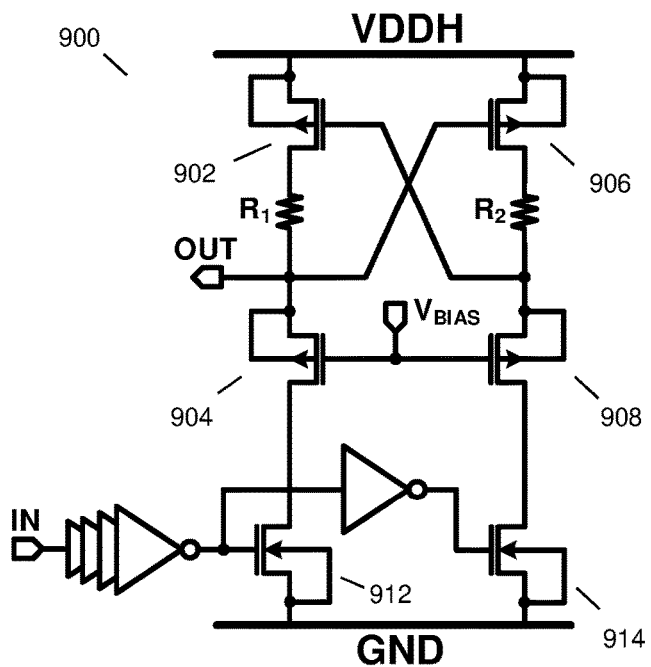
FIG. 9 illustrating a circuit diagram of a high-voltage level shifter in accordance with embodiments of the invention.

In accordance with embodiments of the invention, an exemplary circuit of a high voltage level shifter (which was previously identified as level shifter 210 in FIG. 2) is illustrated in FIG. 9. Level shifter 900 comprises a number of logic gates, PMOS transistors 902, 904, 906, 908 and NMOS transistors 912 and 914. The detailed workings of level shifter 900 are omitted for brevity.

Figure 10:
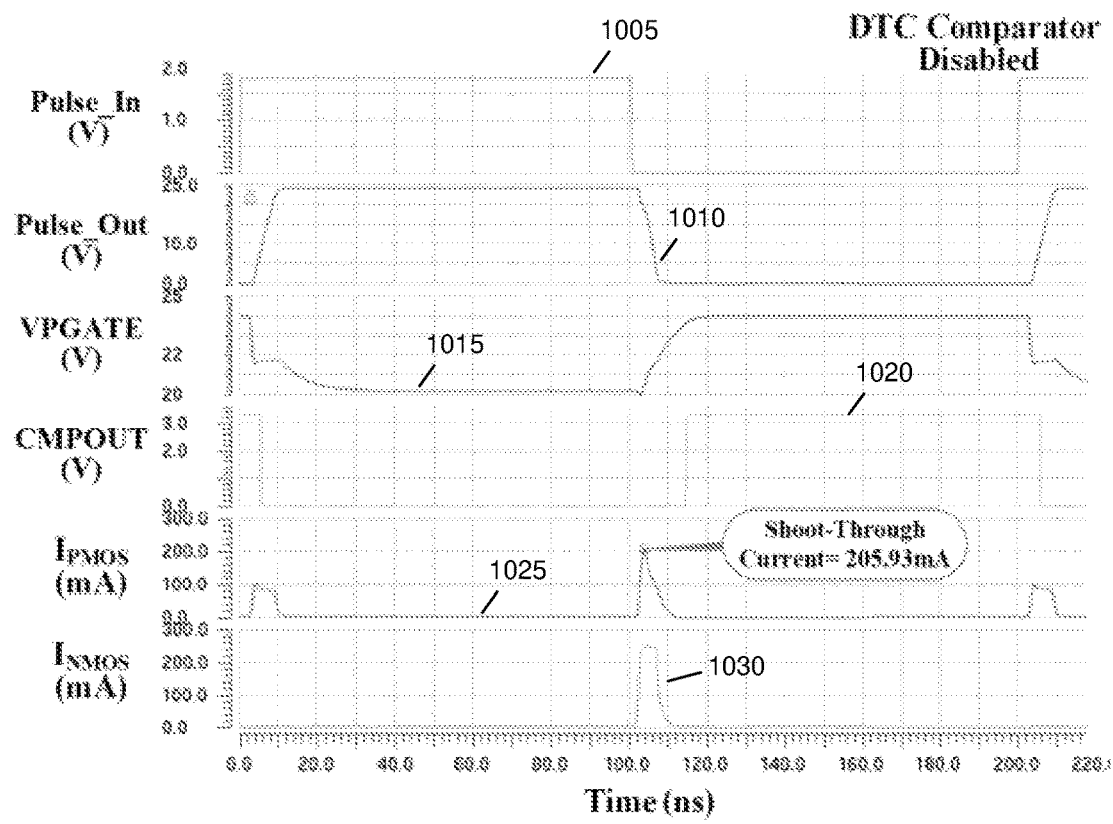
FIG. 10 illustrating a plot showing the generation of shoot-through current when the comparator in accordance with embodiments of the invention is not used in a pulser circuit.

FIG. 10 illustrates the simulated signals for a pulser circuit when the comparator circuit in the pulser circuit is disabled. In particular, plot 1005 illustrates the input pulse signal that is provided to the input port VIN (see FIG. 2), plot 1010 illustrates the output voltage at the output port VOUT, plot 1015 illustrates the gate voltage VPGATE at switching transistor 110, plot 1020 illustrates the output voltage CMPOUT at the output port of the comparator circuit, plot 1025 illustrates the drain current $I_{PMOS}$ flowing through switching transistor 110 and plot 1030 illustrates the drain current $I_{NMOS}$ flowing through switching transistor 120. As illustrated in plot 1025, it can be seen that a significant amount of shoot-through current occurs (around 205 mA) when switching transistor 120 initially switches ON as switching transistor 110 did not switch OFF fast enough.

Figure 11:
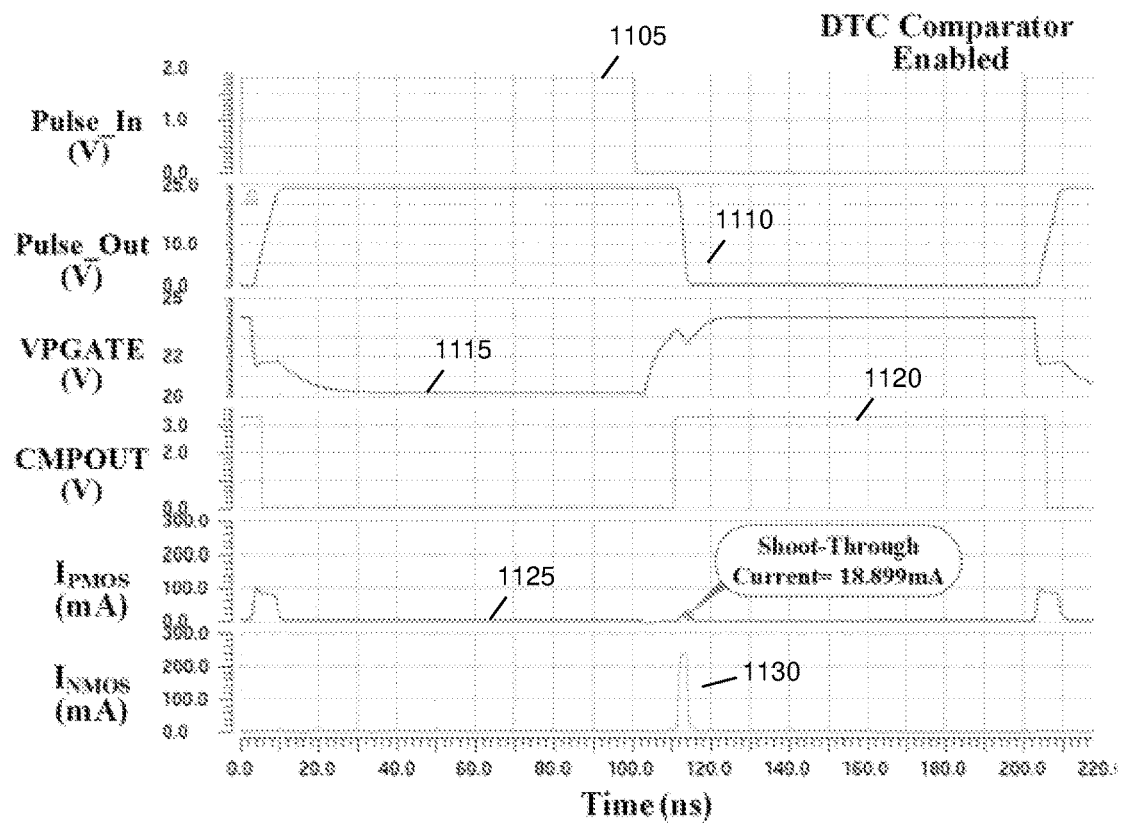
FIG. 11 illustrating a plot showing the generation of shoot-through current when the comparator in accordance with embodiments of the invention is used in a pulser circuit.

The shoot-through current issue is addressed when the comparator circuit is enabled in the pulser circuit in accordance with embodiments of the invention. FIG. 11 illustrates the simulated signals for a pulser circuit when the comparator circuit in the pulser circuit is enabled. In particular, plot 1105 illustrates the input pulse signal that is provided to the input port VIN (see FIG. 2), plot 1110 illustrates the output voltage at the output port VOUT, plot 1115 illustrates the gate voltage VPGATE at switching transistor 110, plot 1120 illustrates the output voltage CMPOUT at the output port of the comparator circuit, plot 1125 illustrates the drain current $I_{PMOS}$ flowing through switching transistor 110 and plot 1130 illustrates the drain current $I_{NMOS}$ flowing through switching transistor 120. As illustrated in plot 1125, it can be seen that the amount of shoot-through current has reduced greatly due to the intervention of the comparator circuit even though switching transistor 110 did not switch OFF fast enough.

The above is a description of embodiments of a circuit and method in accordance with the present invention as set forth in the following claims. It is envisioned that others may and will design alternatives that fall within the scope of the following claims.

The invention claimed is:

1. A comparator circuit configured to generate a delay between an ON time for a first transistor and an OFF time for a second transistor in a pulser circuit, the comparator circuit comprising:

a gate voltage sensing circuit configured to generate a gate monitoring current $I_{PGATE}$ based on a detected gate voltage of the second transistor $V_{PGATE}$;

a current sensing circuit configured to generate a drain monitoring current $I_{PMOS}$ based on a detected drain current of the second transistor; and a current comparator circuit configured to compare a reference current $I_{CMP.REF}$ to a sum of a scaled gate monitoring current $I_{PGATE.MON}$ that is scaled from the gate monitoring current $I_{PGATE}$ and a scaled drain monitoring current $I_{PMOS.MON}$ that is scaled from the drain monitoring current $I_{PMOS}$, whereby the first transistor in the pulser circuit is turned ON when the sum of the scaled gate monitoring current $I_{PGATE.MON}$ and the scaled drain monitoring current $I_{PMOS.MON}$ is less than the reference current $I_{CMP.REF}$.

2. The comparator circuit according to claim 1 wherein the gate monitoring current $I_{PGATE}$ is directly proportional to a voltage difference between the detected gate voltage of the second transistor $V_{PGATE}$ and a source voltage of the second transistor $V_{DDH}$.

3. The comparator circuit according to claim 2 whereby the gate voltage sensing circuit comprises:

a first current source having an input terminal which is provided with the source voltage of the second transistor $V_{DDH}$ and an output terminal connected to a source of a switch transistor, wherein, the switch transistor is configured to regulate the gate monitoring current $I_{PGATE}$ at a drain of the switch transistor based on the detected gate voltage of the second transistor $V_{PGATE}$ that is provided to the gate of the switch transistor.

4. The comparator circuit according to claim 2 whereby the gate voltage sensing circuit comprises:

a resistor having a first end which is provided with the source voltage of the second transistor $V_{DDH}$ and a second end connected to a source of a switch transistor wherein, the switch transistor is configured to regulate the gate monitoring current $I_{PGATE}$ at a drain of the switch transistor based on the detected gate voltage of the second transistor $V_{PGATE}$ that is provided to the gate of the switch transistor.

5. The comparator circuit according to claim 3 whereby the gate voltage sensing circuit further comprises:

a pair of NMOS transistors in a current mirror configuration whereby one of the pair of NMOS transistors is configured to receive the gate monitoring current $I_{PGATE}$ from the drain of the switch transistor such that the gate monitoring current $I_{PGATE}$ is scaled and replicated at a drain of another one of the pair of NMOS transistors and the scaled gate monitoring current $I_{PGATE.MON}$ is provided to the current comparator circuit in place of the gate monitoring current $I_{PGATE}$.

6. The comparator circuit according to claim 1, whereby the current sensing circuit comprises:

a PMOS sensing transistor having a gate which is provided with the gate voltage of the second transistor $V_{PGATE}$, a source which is provided with the source voltage of the second transistor $V_{DDH}$, and a drain connected to a first input terminal of a voltage copy circuit, wherein the voltage copy circuit is configured to provide the drain of the PMOS sensing transistor with a same voltage as a drain of the second transistor $V_{OUT}$ through the first input terminal of the voltage copy circuit, the voltage copy circuit further comprising a second input terminal that is provided with the drain voltage of the second transistor $V_{OUT}$, a first output terminal that is connected to a second current source and a second output terminal that is connected to a third current source;

a negative feedback loop formed between the first input and the first output terminals of the voltage copy circuit, the negative feedback loop configured to direct a drain monitoring current $I_{PMOS}$ from the PMOS sensing transistor away from the voltage copy circuit and through a current branch formed by the negative feedback loop; and a NMOS sensing transistor connected to the negative feedback loop, the NMOS sensing transistor configured to generate the scaled drain monitoring current $I_{PMOS.MON}$ based on the drain monitoring current Imps flowing through the current branch formed by the negative feedback loop.

7. The comparator circuit according to claim 6, whereby the voltage copy circuit comprises:

a pair of PMOS transistors in a current mirror configuration whereby a source of one of the pair of PMOS transistors is configured to detect the drain voltage of the second transistor $V_{OUT}$ through the second input terminal of the voltage copy circuit and another one of the pair of PMOS transistors is configured to replicate the detected drain voltage of the second transistor $V_{OUT}$ at its source, whereby the source of the another one of the pair of PMOS transistors is connected to the drain of the PMOS sensing transistor through the first input terminal of the voltage copy circuit.

8. The comparator circuit according to claim 7 whereby, the second current source comprises a first NMOS transistor configured as a current source, a drain of the first NMOS transistor being connected to the first output terminal of the voltage copy circuit; and the third current source comprises a second NMOS transistor configured as a current source, a drain of the second NMOS transistor being connected to the second output terminal of the voltage copy circuit.

9. The comparator circuit according to claim 8, whereby the negative feedback loop comprises:

a first NMOS feedback transistor having a drain connected to the drain of the PMOS sensing transistor and a source connected to a drain of a second NMOS feedback transistor, whereby a gate of the second NMOS feedback transistor is connected to the first output terminal of the voltage copy circuit.

10. The comparator circuit according to claim 9 whereby a gate of the NMOS sensing transistor is connected to the gate of the second NMOS feedback transistor.

11. The comparator circuit according to claim 10 whereby the drain monitoring current $I_{PMOS}$ from the PMOS sensing transistor comprises a scaled value of the drain current of the second transistor and is obtained based on a channel width ratio between the PMOS sensing transistor and the second transistor; and the scaled drain monitoring current $I_{PMOS.MON}$ from the NMOS sensing transistor comprises a re-scaled or replicated value of the drain monitoring current $I_{PMOS}$ from the PMOS sensing transistor and is obtained based on a channel width ratio between the NMOS sensing transistor and the second NMOS feedback transistor.

12. The comparator circuit according to claim 1 whereby the current comparator circuit comprises:

a fourth current source configured to generate the reference current $I_{CMP.REF}$;

a summation node located between a drain of the fourth current source and a terminal of a capacitor whereby the summation node is configured to receive the scaled gate monitoring current $I_{PGATE.MON}$ and the scaled drain monitoring current $I_{PMOS.MON}$ and to obtain a difference between the reference current $I_{CMP.REF}$ and the sum of the scaled gate monitoring current $I_{PGATE.MON}$ and the scaled drain monitoring current $I_{PMOS.MON}$.

13. The comparator circuit according to claim 1 further comprising:

a level-shifter provided between an input of the pulser circuit and the gate of the second transistor.

14. A method to generate a delay between an ON time for a first transistor and an OFF time for a second transistor in a pulser circuit using a comparator circuit comprising a gate voltage sensing circuit, a current sensing circuit and a current comparator circuit, the method comprising the steps of:

generating, using the gate voltage sensing circuit, a gate monitoring current $I_{PGATE}$ based on a detected gate voltage of the second transistor $V_{PGATE}$;

generating, using the current sensing circuit, a drain monitoring current Imps based on a detected drain current of the second transistor;

comparing, using the current comparator circuit, a reference current $I_{CMP.REF}$ to a sum of a scaled gate monitoring current $I_{PGATE.MON}$ that is scaled from the gate monitoring current $I_{PGATE}$ and a scaled drain monitoring current $I_{PMOS.MON}$ that is scaled from the drain monitoring current $I_{PMOS}$; and switching the first transistor in the pulser circuit ON when the sum of the scaled gate monitoring current $I_{PGATE.MON}$ and the scaled drain monitoring current $I_{PMOS.MON}$ is less than the reference current $I_{CMP.REF}$.

* * * * *